(12) United States Patent
Patrick et al.

(10) Patent No.: US 6,928,275 B1
(45) Date of Patent: *Aug. 9, 2005

(54) METHOD AND APPARATUS FOR COMPENSATING LOCAL OSCILLATOR FREQUENCY ERROR

(75) Inventors: Christopher Patrick, San Diego, CA (US); Saed G. Younis, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/567,803

(22) Filed: May 8, 2000

(51) Int. Cl.[7] .................................................. H04B 1/06
(52) U.S. Cl. ....................... 455/256; 455/255; 455/258; 455/264; 331/176; 331/177 R; 342/357.12
(58) Field of Search .............................. 331/176, 177 R, 331/70, 44, 105, 16, 116.12, 158; 455/255, 455/256, 257, 258, 259, 260, 264, 70; 342/357.02, 342/357.09, 357.15, 357.12; 375/344

(56) References Cited

U.S. PATENT DOCUMENTS

| | | | | |
|---|---|---|---|---|
| 5,113,416 A | * | 5/1992 | Lindell | ........................ 331/158 |
| 5,172,075 A | * | 12/1992 | Yerbury et al. | ................ 331/14 |
| 5,204,975 A | * | 4/1993 | Shigemori | ................... 455/231 |
| 5,420,593 A | * | 5/1995 | Niles | ..................... 342/357.12 |
| 5,604,468 A | * | 2/1997 | Gillig | ......................... 327/105 |
| 5,649,320 A | * | 7/1997 | Korhonen et al. | .......... 331/176 |
| 5,654,718 A | | 8/1997 | Beason et al. | ............... 342/357 |
| 5,663,735 A | * | 9/1997 | Eshenbach | ............. 342/357.15 |
| 5,717,403 A | * | 2/1998 | Nelson et al. | ......... 342/357.12 |
| 5,731,742 A | * | 3/1998 | Wojewoda et al. | ......... 331/158 |
| 5,740,525 A | * | 4/1998 | Spears | ........................ 455/259 |
| 5,742,908 A | * | 4/1998 | Dent | ........................... 455/517 |
| 5,774,800 A | * | 6/1998 | Mori | ........................... 455/255 |
| 5,777,524 A | * | 7/1998 | Wojewoda et al. | ...... 331/116 R |
| 5,841,396 A | * | 11/1998 | Krasner | ................. 342/357.02 |
| 5,848,355 A | * | 12/1998 | Rasor | ......................... 455/260 |
| 5,854,605 A | * | 12/1998 | Gildea | ................... 342/357.03 |
| 5,856,766 A | * | 1/1999 | Gillig et al. | ................. 327/105 |
| 5,875,388 A | * | 2/1999 | Daughtry et al. | ........... 331/158 |
| 5,892,408 A | * | 4/1999 | Binder | ........................ 331/44 |

(Continued)

FOREIGN PATENT DOCUMENTS

| | | | | |
|---|---|---|---|---|
| EP | 0483090 | 10/1997 | ............. | H03J 7/06 |
| WO | 9714049 | 4/1997 | ............. | G01S 1/04 |
| WO | 9825157 | 6/1998 | ............. | G01S 5/14 |

*Primary Examiner*—Charles N. Appiah
(74) *Attorney, Agent, or Firm*—Philip Wadsworth; Bruce Greenhaus; Richard Bachand

(57) ABSTRACT

The frequency error of an oscillator is minimized by characterizing the oscillator. A reference signal from an external source containing a minimal frequency error is provided to an electronic device. The external signal is used as a reference frequency to estimate the frequency error of an internal frequency source. The electronic device monitors parameters that are determined to have an effect on the frequency accuracy of the internal frequency source. Temperature is one parameter known to have an effect on the frequency of the internal frequency source. The electronic device collects and stores the values of the parameters as well as the corresponding output frequency or frequency error of the internal frequency source. The resultant characterization of the internal frequency source is used to compensate the internal frequency source when the internal frequency source is not provided the external reference signal.

15 Claims, 8 Drawing Sheets

U.S. PATENT DOCUMENTS

| | | |
|---|---|---|
| 6,097,974 A * | 8/2000 | Camp et al. ............. 455/575.7 |
| 6,122,506 A * | 9/2000 | Lau et al. ................. 455/12.1 |
| 6,161,003 A * | 12/2000 | Lo Curto et al. ............. 331/10 |
| 6,222,483 B1 * | 4/2001 | Twitchell et al. ...... 342/357.09 |
| 6,233,292 B1 * | 5/2001 | Van Bezooijen et al. ... 375/344 |
| 6,243,570 B1 * | 6/2001 | Kobayashi ............... 455/184.1 |
| 6,424,826 B1 * | 7/2002 | Horton et al. ............. 455/255 |
| 6,472,943 B1 * | 10/2002 | Soong et al. ................. 331/44 |
| 6,522,871 B1 * | 2/2003 | Patrick et al. ............. 455/256 |
| 6,559,731 B2 * | 5/2003 | Jakobsson ................... 331/176 |

* cited by examiner

METHOD AND APPARATUS FOR COMPENSATING LOCAL OSCILLATOR FREQUENCY ERROR

BACKGROUND OF THE INVENTION

I. Field of the Invention

The present invention relates to electronic circuits. More particularly, the present invention relates to a novel and improved method and apparatus for compensating Local Oscillator (LO) frequency error by characterizing the LO frequency over time.

II. Description of the Related Art

Accurate frequency sources are vital to the operation of numerous electronic systems and devices. Frequency sources are used as timing sources within electronic devices and are also used as Local Oscillators (LO) to tune electronic devices to desired communication channels.

Many types of accurate frequency sources are available. The specific type of frequency source implemented within a particular application is determined according to the design constraints of the particular application. Atomic clocks exhibit extreme levels of frequency accuracy, however, their size, cost, and absence of tuning range greatly limit their actual application within an electronic system. Similarly, accurate frequency sources can be designed utilizing the piezoelectric effect of quartz crystals. The small size and relative accuracy of quartz crystal based frequency sources make them popular for most consumer based electronic devices.

The application determines the type and frequency accuracy required of a frequency source. A receiver used for Global Positioning System (GPS) applications requires a LO with a high level of frequency accuracy in order to quickly acquire and maintain synchronization with the signals provided on the GPS carrier frequencies transmitted from the satellites. An overview of GPS helps to explain the requirement for LO frequency accuracy in a GPS receiver.

GPS is commonly used for position determination. GPS accomplishes position determination using geometric principles. A constellation of GPS satellites orbits the earth. A receiver can determine its exact position by knowing the positions of the satellites and calculating the distance from the receiver to each of a number of satellites.

The GPS receiver calculates the distance from the satellite to the receiver by determining the time it takes for a signal transmitted by the satellite to reach the receiver. Once the receiver determines its distance from the satellite it knows that it resides on a locus of points equidistant from the satellite. The satellite appears as a point source and the locus of points equidistant from a point is a spherical surface. When the receiver determines its distance from a second satellite the receiver knows that its position is located somewhere on a second spherical surface. However, the potential positions are greatly reduced when the distance from two satellites is known. This is because the location of the receiver lies somewhere on the intersection of the two spherical surfaces. The intersection of two spherical surfaces is a circle. Therefore, the receiver knows that its position lies on the circle of intersection. Determining the distance from the receiver to a third satellite creates a third spherical surface. The third spherical surface intersects the first two surfaces and also intersects the circle that defines the intersection of the first and second spherical surfaces. The intersection of the three spherical surfaces results in two distinct points where the receiver may be located. Once the two points generated by the intersection of three spherical surfaces has been determined the receiver can estimate which of the two points is the correct location or the receiver can determine its distance from a fourth satellite.

The receiver can estimate which one of the two points is its correct location once the distances from three satellites have been determined. This can be done because one of the two points is not a likely location. The correct one of the two points will likely be near the surface of the earth whereas the incorrect point likely will be very far above the surface of the earth or deep within the surface of the earth. The exact position of the receiver will be known if the distance from a fourth satellite is determined. The exact position is known using four satellites because the intersection of four spherical surfaces results in only one point.

The main problem in a GPS implementation is the accurate determination of the distance from the satellite to the receiver. Distance from the satellite to the receiver is calculated by measuring the time of arrival of a signal transmitted from the satellite to the receiver. Each satellite transmits two carrier frequencies each modulated with a unique pseudo random code. One of the carrier frequencies operates at 1575.42 MHz and the other carrier frequency operates at 1227.60 MHz. The receiver demodulates the received signal to extract the pseudo random code. A locally generated pseudo random code is synchronized to the demodulated pseudo random code. The delay between the two pseudo random codes represents the time of arrival of the transmitted signal. The distance from the satellite can then be determined by multiplying the time of arrival by the velocity of light.

All of the transmitting satellites are time synchronized. However, the mobile receiver is only weakly synchronized to the satellites. The weak time synchronization of the receiver to the satellites introduces errors into the position determination. As stated above, a distinct time of arrival corresponds to a distinct distance. The locus of points equidistant from a point is a spherical surface with a radius equal to the distance. However, if the time of arrival is only known to lie within a range of times, that is a measured time plus or minus some error, then the distance can only be known to lie within the corresponding range of values. The locus of points equidistant from the source is a spherical shell in the case where the distance is only known to lie within a range of values. The thickness of the spherical shell is equal to the error in the distance measurement. The intersection of three spherical shells, each shell corresponding to a position estimate based on an additional satellite, results in two solids, one of which represents the position of the receiver. Recall that in the case of discrete distances the intersection of the three spherical surfaces results in two points rather than two solids.

The time synchronization problem is partially solved by including the distance measurement from a fourth satellite. First, the time error is assigned an assumed value, even zero. Then the distances from three satellites are determined. As explained earlier, the intersection of the three spherical surfaces defined by these three distance measurements results in two distinct points, one of which is the position of the receiver. The distance from a fourth satellite defines a fourth spherical surface. Ideally, in the case of no timing error, the fourth spherical surface intersects the other three spherical surfaces at only one point. However, the four spherical surfaces do not intersect when a timing error is present. There is no timing error between the satellites. Therefore, the timing error from the receiver to one satellite is the same as the timing error from the receiver to any of the satellites in the constellation. The timing error can be determined by adjusting the value of the assumed timing error. The timing error is determined when the four spherical surfaces intersect in a single point.

Resolution of the timing error is only one of the problems that must be dealt with when position determination using GPS is implemented. A GPS position determination receiver must be implemented in a small physical size at a relatively low cost. The size and cost constraints become increasingly important when the GPS receiver is implemented in a consumer oriented device. New requirements for wireless phones include the ability to determine a caller's location. The specific location of a wireless telephone is important in the case of an emergency call such as a 911 call within the United States. Yet, despite the physical design constraints, the receiver must quickly search and acquire the satellite signals.

A receiver design must tradeoff cost, receive signal sensitivity, and search time. A receiver design cannot maximize all parameters simultaneously. Significant improvements in receiver sensitivity or search time result in increased receiver cost.

A major contributor to the complexity associated with searching and acquiring the satellite signal is the frequency error attributable to the receiver Local Oscillator (LO). The LO is used in the receiver to downconvert the received signal to a baseband signal. The baseband signal is then processed. In the case of a signal received from a GPS satellite the baseband signal is correlated to all possible pseudo random codes to determine which satellite originated the signal and to determine the time of arrival of the signal. The search and acquisition process is greatly complicated by the LO frequency error. Any frequency error contributed by the LO creates additional search space that must be covered. Furthermore, the LO frequency error presents a separate dimension over which time of arrival must be searched. Thus, the search space is increased in proportion to the frequency error, since the time of arrival search must be conducted over all possible frequency errors.

Many parameters contribute to real or perceived LO frequency error. The circuit operating temperature as well as the temperature gradient across the circuit board affects the LO frequency. Additionally, the frequency stability of the frequency reference used for the LO contributes directly to the LO frequency stability. An additional contributor to frequency error is the doppler shift contribution attributable to the velocity of the receiver. Even in the situation where the receiver LO is perfectly accurate there may be a perceived frequency error due to the doppler shift contribution. The shift may cause either an apparent increase or an apparent decrease in the frequency of the satellite transmission. Although both the satellite and the receive LO may be perfectly stable the signal at the receiver appears to have shifted in frequency. Doppler shift contributed by the movement of the receiver is not corrected within the receiver and only contributes to any frequency error already present in the receiver.

What is required is a manner of reducing the LO frequency error to reduce the search space that must be covered in baseband signal processing. Reduction in the search space allows for lower search complexity, which in turn allows for greater receiver sensitivity and decreased search and acquisition times.

SUMMARY OF THE INVENTION

The present invention is a novel and improved method and apparatus for reducing the frequency error of a Local Oscillator (LO) by characterizing the LO over numerous operating conditions and compensating the LO based upon the operating conditions.

While operating in a first mode, an external frequency source having a small frequency uncertainty is provided to a receiver. The receiver uses the external frequency source as a frequency reference. The receiver estimates the frequency error of the LO using the external frequency source as a frequency reference. Simultaneous to the frequency estimate the receiver monitors various predetermined parameters that are known to have an affect on the accuracy and frequency stability of the LO. Operating temperature and temperature gradients along the circuit board are examples of parameters that affect the LO accuracy. The monitored parameter values and the LO frequency are stored in memory locations. Alternatively, the frequency error can be stored in the table. This provides a series of data tables which characterize the LO.

The LO can be switched to a higher accuracy second mode where the LO output frequency is controlled to achieve a lower frequency error. In the higher accuracy second mode the receiver no longer utilizes the external frequency source. The receiver continues to monitor the predetermined parameters that were used to characterize the LO. The receiver then uses the current results of the monitored parameters and compares them to the values in the previously stored tables. An estimate of the LO error is then made based on the comparison of the current parameters with the stored parameter measurements. The LO is then compensated to correct for the estimated error based on the prior characterization.

In an alternate embodiment the frequency error is reported to the receiver such that a signal acquisition process can be simplified. In another embodiment the LO operates in a higher accuracy mode where the output of the LO is compensated for the frequency error and the frequency error is also reported to the receiver. In yet another embodiment the first mode where the frequency error is characterized operates simultaneously with the second mode.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
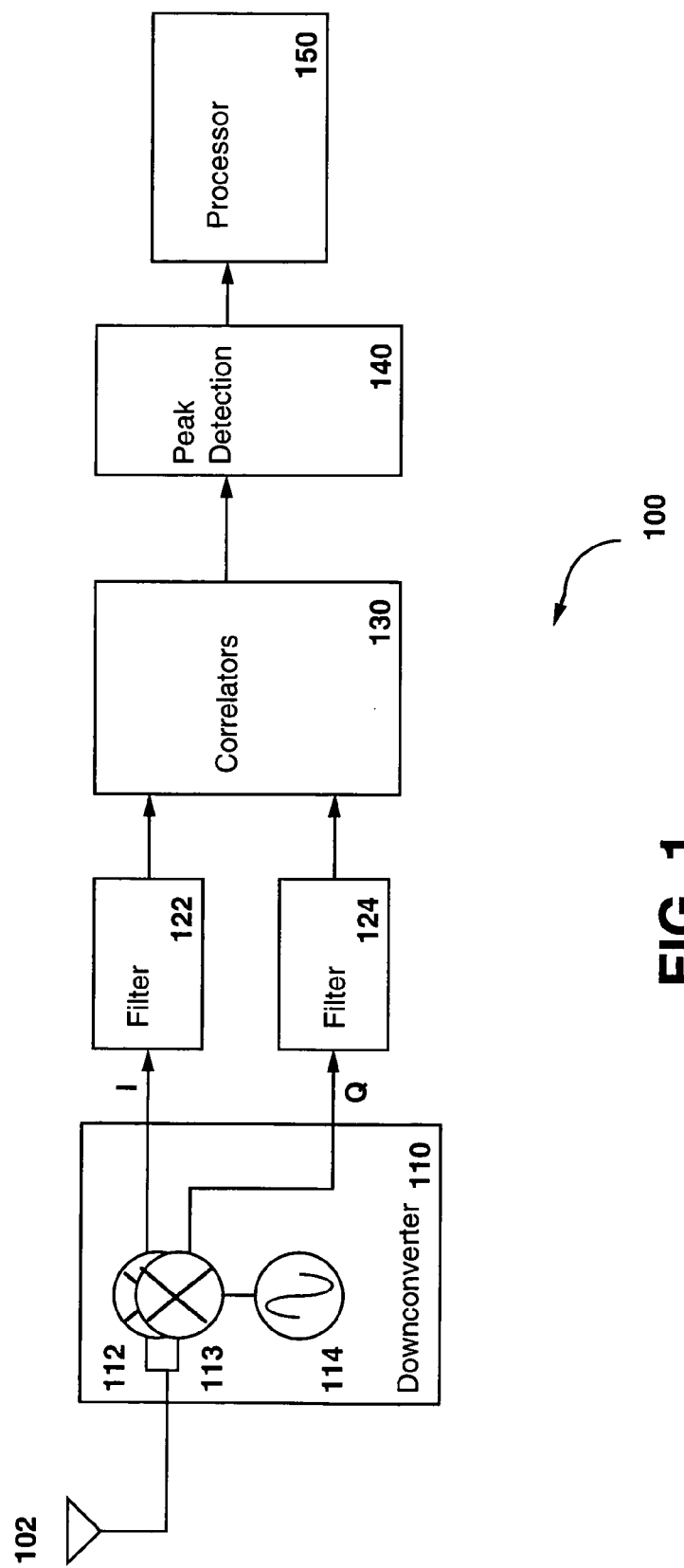
FIG. 1 is a block diagram of a receiver.

FIG. 1 is a block diagram of a generic receiver 100. The antenna 102 serves as the interface between broadcast signals and the receiver 100. The antenna 102 is tuned to optimally receive signals transmitted in the L-Band where the receiver 100 is configured as a GPS receiver. In the case of a GPS receiver, the source of the broadcast signals is the constellation of GPS satellites orbiting the earth. The signals received by the antenna 102 are coupled to a downconverter 110. The downconverter 110 serves to downconvert the RF signals received by the antenna 102 to baseband signals that are further processed. The main components of the downconverter 110 are the mixers 112 and the Local Oscillator (LO) 114. The downconverter 110 may also include filters and amplifiers (not shown) to maximize the quality of the resultant baseband signal. The received signal is coupled from the antenna 102 to the mixer 112 within the downconverter 110. Any filtering or amplification of the signal within the downconverter 110 is not shown in order to simplify the block diagram to its functional components. The mixer 112 acts to effectively multiply the received signal with the LO 114 signal. The resultant signal output from the mixer 112 is centered at two primary frequencies. One frequency component of the mixer 112 output is centered at the sum of the received signal center frequency and the LO 114 operating frequency. The second frequency component of the mixer 112 output is centered at the difference between the received signal center frequency and the LO 114 operating frequency. Two mixers 112–113 are used in the downconverter 110 when the received signal is quadrature modulated. The received signal is used as the input to both mixers 112–113. The second input on the first mixer 112 is the LO 110 signal. The second input on the second mixer 113 is the LO 114 signal offset by ninety degrees in a phase shifter (not shown). The resultant output of the first mixer 112 is labeled the incident phase output (I) and the resultant output of the second mixer 113 is labeled the quadrature phase output (Q).

The I and Q outputs from the downconverter 110 are coupled to respective filters, 122 and 124, that are used to remove the undesired frequency component from the mixers 112–113 and to precondition the downconverted signal prior to subsequent signal processing.

The filtered I and Q signals are coupled to a bank of correlators 130. The correlators 130 utilize digital signal processing techniques to process the I and Q signals. The correlators digitize the I and Q signals in Analog to Digital Converters (ADC) to permit digital signal processing. The correlators 130 are used to determine the phase offset of the received satellite signals when the receiver 100 is configured for GPS position determination. The receiver 100 has no prior knowledge as to its position when it is first powered up. The receiver 100 determines its initial position by searching through all the possible pseudo random code sequences transmitted by each satellite. Additionally, the receiver 100 must search through all of the possible phases of all possible pseudo random codes. The search is performed by a number of correlators operating in parallel to minimize the search time required by the receiver 100. Each correlator operates on a single pseudo random sequence. The correlator attempts to determine the phase offset of an internally generated pseudo random code to the code received from the satellite. Pseudo random codes that do not correspond to the satellite signal will have no correlation because of the random nature of the codes. Additionally, the correct pseudo random code will have no correlation with the received signal unless the phases of the two code signals are aligned. Thus, the correlators 130 will only provide an indication of correlation in the correlator having the same pseudo random code as the received signal when the phases of the two signals is aligned.

The correlator results are coupled to a peak detection 140 processor. The many correlators operate in parallel and simultaneously provide results to the peak detection 140 processor. The peak detection 140 processor determines the most likely pseudo random codes and phase offsets for the received signal.

GPS utilizes orthogonal codes for each of the satellites. This allows all of the satellites to simultaneously transmit at the same frequency. The receiver is thus simultaneously presented information from multiple sources. The multiple correlators 130 operate independently of each other and can determine the phase of a received pseudo random code in the presence of other orthogonal codes. Therefore, the peak detection 140 processor is simultaneously provided correlation numbers identifying a number of pseudo random codes and the phase offset for those codes. Since each satellite is assigned a pseudo random code, the identification of a pseudo random code identifies a particular satellite as its source. Additionally, the determination of the code phase offset determines the time of arrival of that signal. The processor 150 analyzes the information in the peak detection 140 processor to calculate the receiver's 100 position. The simultaneous determination of the pseudo random code and code phase offsets allows the processor 150 to make an estimate of receiver position as the peak detection 140 processor is updated.

Figure 2:
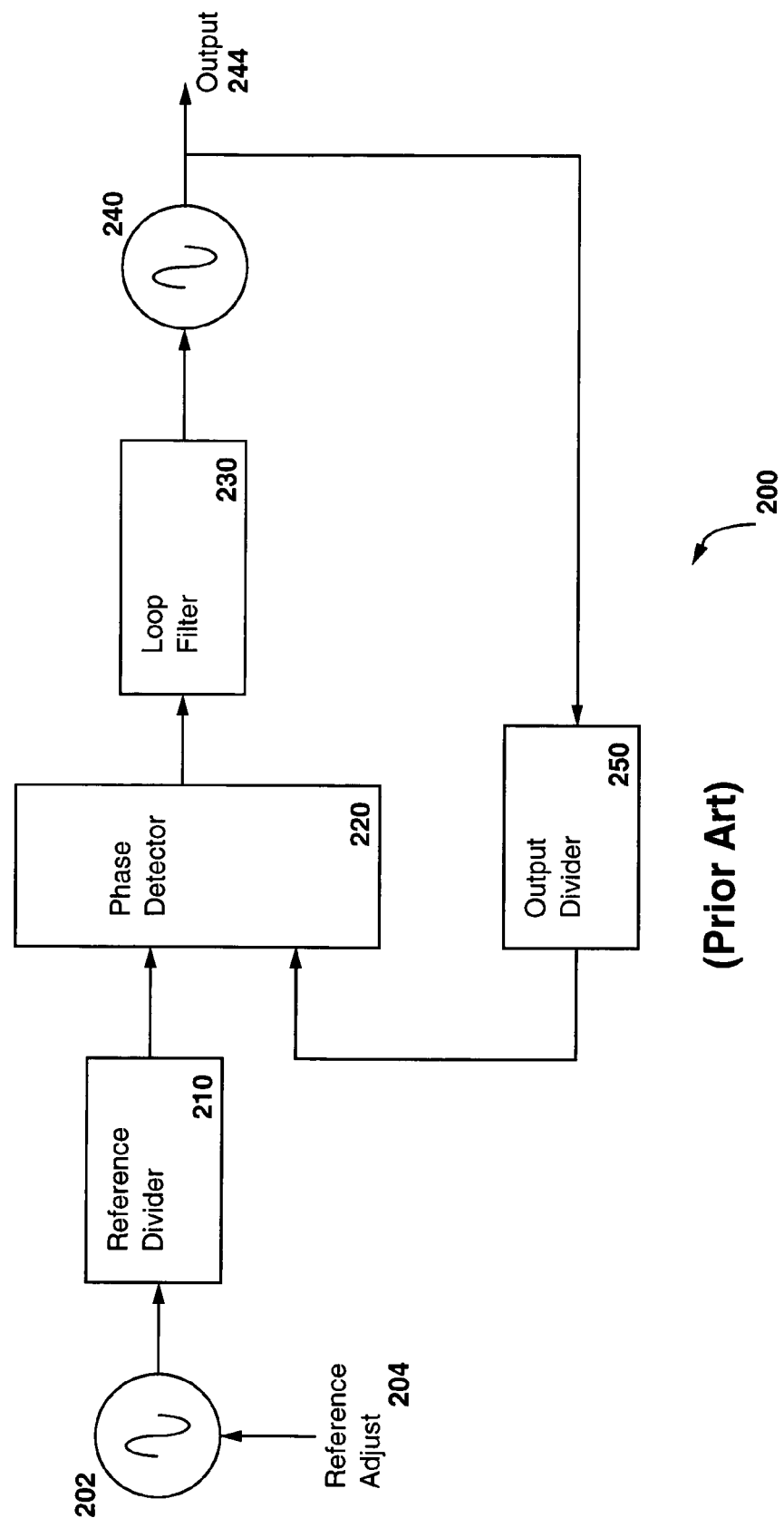
FIG. 2 is a block diagram of a local oscillator.

However, the search process is complicated if the LO 114 frequency within the downconverter 110 is inaccurate. FIG. 2 shows a block diagram of a typical Phase Locked Loop (PLL) synthesized LO 200. A reference oscillator 202 is used as a frequency reference for a PLL. The reference oscillator 202 may be a fixed oscillator or may be a stable Voltage Controlled Oscillator (VCO) with a small tuning range. A wireless phone may utilize a Voltage Controlled Temperature Compensated Crystal Oscillator (VCTCXO) as the reference oscillator 202. A reference adjust control line 204 is provided where a VCO is used as the reference oscillator 202.

The output of the reference oscillator 202 is coupled to a reference divider 210. The reference divider 210 is used to scale down the frequency of the reference oscillator 202. This is important because the output frequency of the PLL is proportional to the frequency input to the phase detector 220. The output of the reference divider 210 is provided as one input to the phase detector 220.

A VCO 240 generates the output 244 of the PLL. The VCO must be capable of tuning over the desired frequency range of the PLL. The voltage applied on the VCO control line determines the frequency of operation. The output 244 of the PLL can be used as the input to the mixers in a downconverter. The PLL output 244 is also coupled to the input of an output divider 250. The output divider 250 scales the frequency output 244 such that the frequency input to the phase detector 220 (the scaled output of the reference oscillator 204) multiplied by the output divider 250 scale factor results in the desired output frequency. The output of the output divider 250 is provided as a second input to the phase detector 220.

The phase detector 220 compares the output of the reference divider 210 to the output of the output divider 250 and generates an error signal as an output. The error signal output from the phase detector 220 is coupled to a loop filter 230. The loop filter 230 band limits the error signal from the phase detector 220. The output of the loop filter 230 is used as the control voltage on the VCO 240. Therefore, it can be seen that the PLL output 244 derives its frequency accuracy from the frequency accuracy of the reference oscillator 202.

Figure 3:
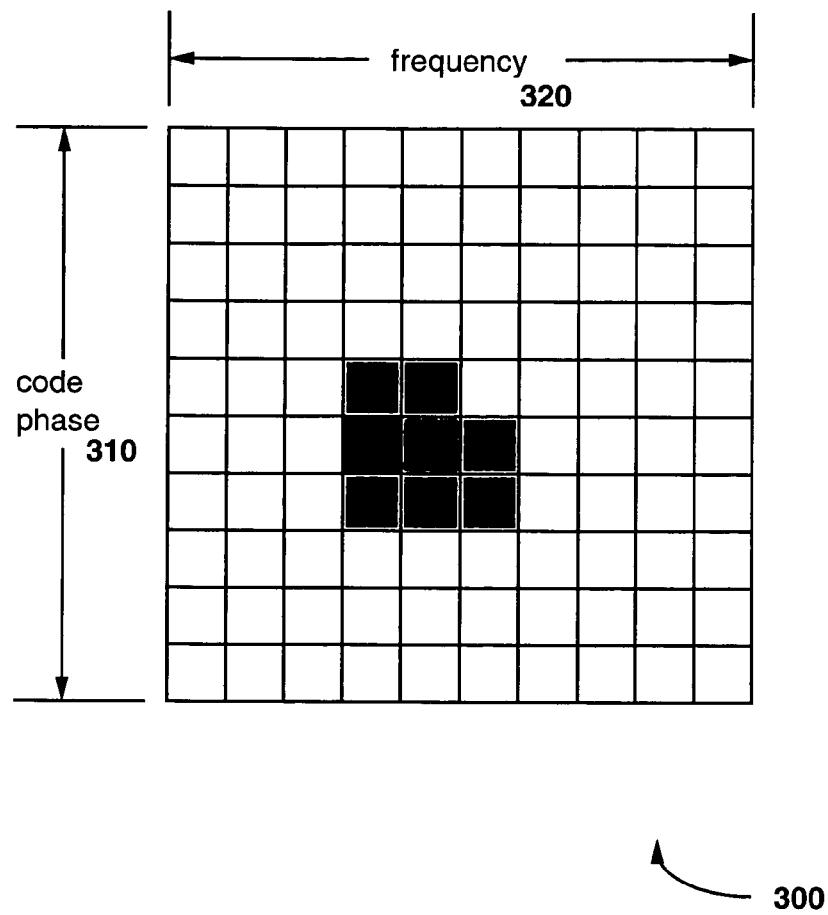
FIG. 3 is a diagram illustrating the search space.

Errors in the frequency accuracy of the LO complicate the search process. The complete search space 300 that each correlator must cover is illustrated in FIG. 3. Each correlator in a GPS receiver must search through all code phase possibilities. The code phase search space 310 is shown as the vertical search space in FIG. 3. Each bin in the code phase search space 310 represents the smallest discernable phase difference. The short pseudo random code length used for GPS is 1023 bits long. The code phase search space 310 must cover all potential code phases if the pseudo random nature of the code results in negligible correlation for all code phase offsets greater than zero. Therefore, at least 1023 bins are required in the code phase search space 310 to uniquely identify the phase of the pseudo random code.

It can be seen from FIG. 3 that an increase in the frequency search space 320 proportionally increases the complete search space 300. The frequency search space 320 represents an additional search dimension since the frequency error is mutually exclusive of any code phase error. Each bin in the frequency search space 320 represents the minimum discernable frequency span. The size of the minimum discernable frequency span is a function of the number of samples and the total integration time. The minimum discernable frequency span decreases as the total integration time increases. Additionally, a sufficient number of samples are required to achieve a desired discernable frequency span. An increase in the LO drift results in an increased frequency search space 320.

The receiver correlates samples within each bin defined in the complete search space 300. Successive results are accumulated to further improve the Signal to Noise Ratio (SNR) of the received signal. LO drift causes the results of the accumulation to appear in a number of bins corresponding to the frequency drift. This "smearing" of the signal is shown in FIG. 3 as shading in a number of the frequency bins. An LO which exhibits no drift enables the results of the accumulation to appear in one single frequency bin. This greatly improves signal identification through increased SNR.

Figure 4:
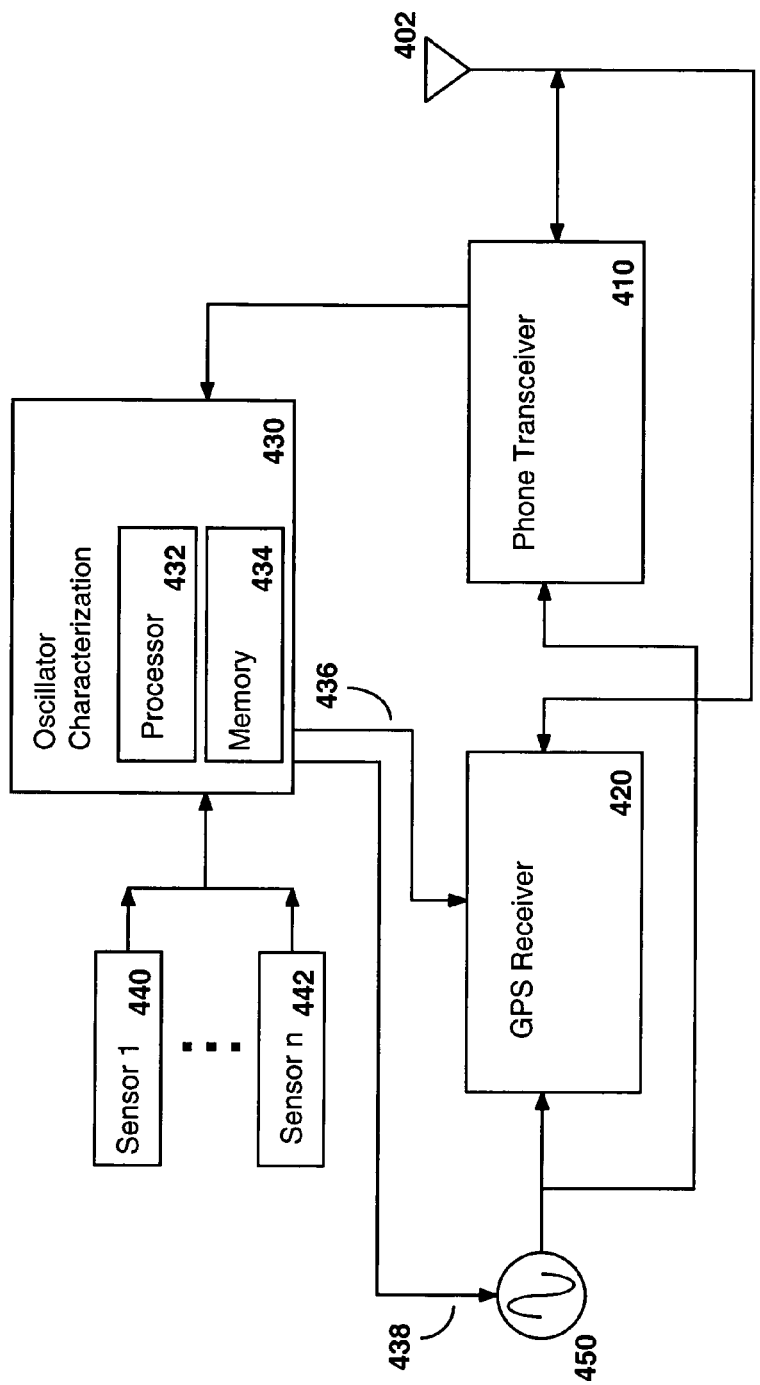
FIG. 4 is a block diagram of a receiver implementing LO characterization.

FIG. 4 shows a block diagram of the LO stabilization circuit in a wireless phone 400 having GPS capability. The wireless phone 400 incorporates a phone transceiver 410 that allows communication through the wireless phone system. The wireless phone 400 also incorporates a GPS receiver 420 to assist in position determination. In the embodiment shown in FIG. 4 the wireless phone 400 operates either in the phone mode or the GPS mode, both modes do not operate simultaneously. However, both phone and GPS modes may operate simultaneously if sufficient processing capability exists within the wireless phone 400.

Radio Frequency (RF) signals couple to and from the wireless phone using the antenna 402. The RF signals coupled through the antenna 402 include the phone transceiver 410 transmit and receive signals as well as the receive signals for the GPS receiver 420. In the embodiment shown in FIG. 4 the GPS receiver 420 and the phone transceiver 410 share a common LO 450. As discussed above, inaccuracy in the LO 450 results in a larger search space for the GPS receiver 420. Therefore, the embodiment shown in FIG. 4 utilizes information received by the phone transceiver 410 to characterize the LO 450 such that when the GPS receiver 420 performs a search the LO 450 frequency error is minimized.

To characterize the internal LO 450 the wireless phone 400 is provided an external signal that has high frequency stability. In a wireless system such as a Code Division Multiple Access (CDMA) system specified in Telecommunications Industry Association (TIA)/Electronics Industries Association (EIA) 95-B MOBILE STATION-BASE STATION COMPATIBILITY STANDARD FOR DUAL-MODE SPREAD SPECTRUM SYSTEMS, signals are continuously being broadcast by the base stations. The signals that are continuously being broadcast by the base stations include the pilot channel and the sync channel. Both of these signals exhibit high frequency stability and either can be used as the external reference needed to characterize the LO 450.

A wireless phone 400 designed to operate in a CDMA system such as the one specified by TIA/EIA 95-B incorporates a searcher within a receiver to continually search for the presence of pilot signals. In the wireless phone 400 the receiver within the phone transceiver 410 receives a pilot signal transmitted by a base station (not shown).

The wireless phone 400 is able to take advantage of the presence of the pilot signal to improve the signal acquisition in GPS mode. The receiver utilizes the frequency stable pilot signal as an external frequency reference to determine the frequency error in the LO 450. The frequency error determined by the receiver is reported to an oscillator characterization circuit 430. Additionally, sensors 440, 442 are distributed throughout the wireless phone 400 to monitor factors that contribute to LO 450 frequency error. The sensors 440, 442 may monitor factors including, but not limited to, temperature, temperature gradients, RF Power Amplifier (PA) operation, RF PA duty cycle, battery voltage, cumulative power on time, humidity, or any other variable that is determined to contribute to LO 450 frequency error. A sensor 440 couples a signal to the oscillator characterization circuit 430. A number of digitized values corresponding to the sensor 440 readings are averaged and the average is stored in an array in memory 434. If the sensor 440 outputs an analog value the oscillator characterization circuit 430 digitizes the readings prior to averaging and storing the average value in memory 434. If the sensor 440 outputs a digital value then the oscillator characterization circuit 430 does not need to further condition the signal and merely saves the averaged digital sensor 440 reading. A processor 432 that forms a part of the oscillator characterization circuit 430 performs the averaging function.

The oscillator characterization circuit 430 also averages a number of the frequency error readings determined and reported by the phone transceiver 410. The averaged frequency error reading is also stored in an array in memory 434. The averaged frequency error is stored in a memory 434 location associated with the corresponding averaged sensor 440–442 readings. In this manner a snapshot of the operating environment and corresponding frequency error of the LO 450 is cataloged. The oscillator characterization circuit 430 continues to accumulate new sensor 440 readings and the corresponding frequency error as long as the wireless phone 400 is operating in phone mode. When the wireless phone 400 operates in GPS mode the oscillator characterization circuit 430 utilizes the previously saved sensor 440 reading and frequency error information to assist the GPS receiver 420 in signal acquisition.

To assist in GPS signal acquisition the oscillator characterization circuit 430 reads the values of each of the sensors 440–442. Then the processor 432 compares the current sensor 440–442 values against the array of previously stored values. The probable LO 450 frequency error is determined as the previously stored value corresponding to the sensor 440–442 readings. If the exact sensor 440–442 readings are not present in the array, the processor 432 interpolates between the existing values or extrapolates from the existing values. The oscillator characterization circuit 430 thereby determines a probable LO 450 frequency error. The oscillator characterization circuit 430 then generates an error signal that is applied to the LO control line 438 to compensate for the frequency error. In one embodiment the error signal is converted from a digital value to an analog value to be applied to the LO using an over-sampled high dynamic range delta-sigma modulator as the digital to analog converter. The oscillator characterization circuit 430 may alternatively send the value of the frequency error to the GPS receiver 420 on an information bus 436. Knowledge of the frequency error allows the GPS receiver 420 to narrow the search space and acquire the signal with fewer calculations. The oscillator characterization circuit 430 may alternatively provide a combination of the two corrections. The oscillator characterization circuit 430 may provide the GPS receiver 420 an indication of the frequency error upon initial entry into GPS mode then may correct for any frequency drift by providing a signal on the LO control line 438 while the wireless phone 400 remains in the GPS mode. Actively correcting the LO 450 frequency drift minimizes the signal smearing that occurs when the LO 450 frequency drifts over multiple frequency bins during accumulation of successive correlations.

LO 450 frequency error compensation using a signal provided on an LO control line 438 can be performed on a PLL synthesized LO 200 as shown in FIG. 2. Referring back to FIG. 2, recall that the output frequency 244 is proportional to the output of the reference oscillator 202. Once the VCO gain of the reference oscillator 202 is known the change in output frequency 244 for a given change in the reference adjust 204 voltage can be determined. Thus, the oscillator characterization circuit 430 of FIG. 4 can calculate a voltage to drive the reference adjust 204 line of the PLL synthesized LO 200 to compensate for a determined frequency error.

Figure 5:
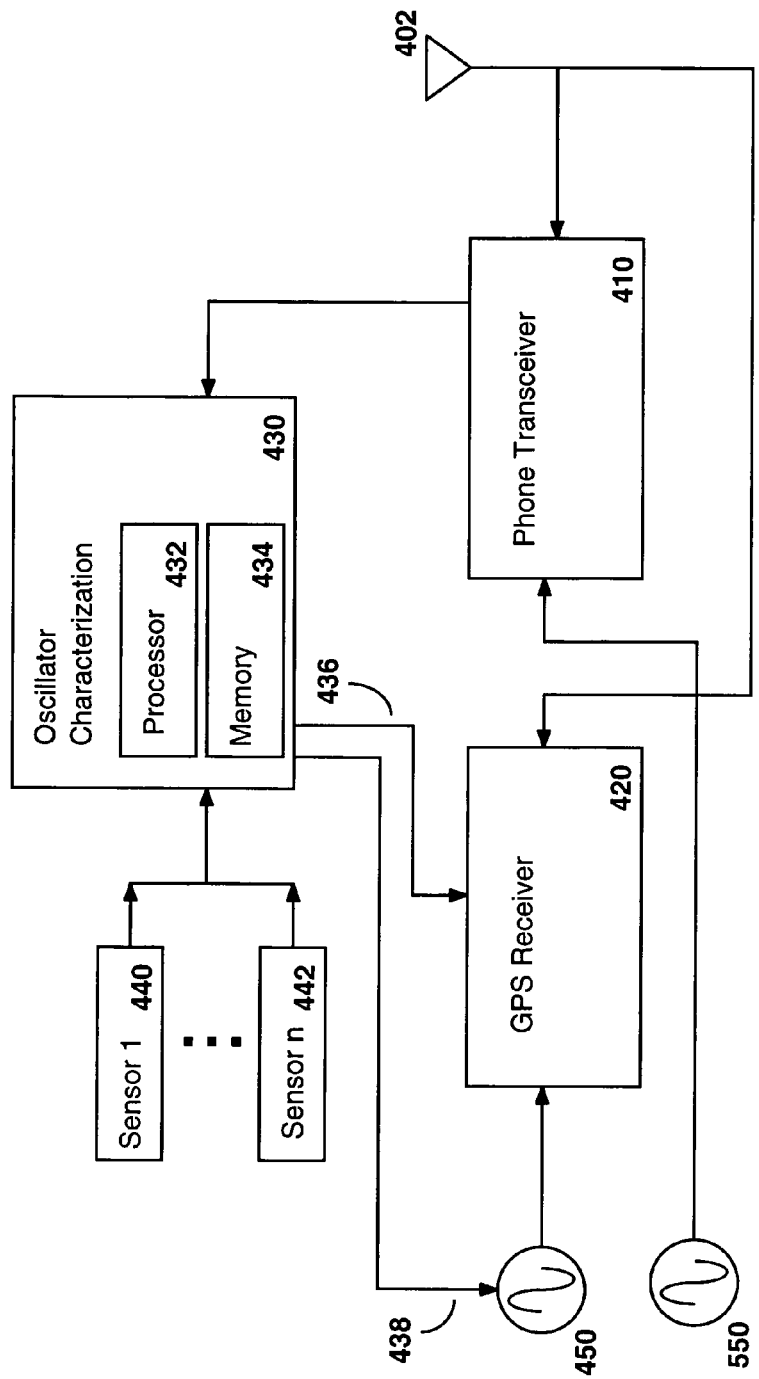
FIG. 5 is a block diagram of an alternative embodiment of a receiver implementing LO characterization.

An alternative embodiment of a wireless phone 500 is shown in FIG. 5. The wireless phone 500 of FIG. 5 incorporates both a phone transceiver 410 and GPS receiver 420 as described above. However, in the wireless phone 500 of FIG. 5 the phone transceiver 410 utilizes a first LO 550 distinct from the GPS receiver 420 or second LO 450. Here the terms first and second LO are used to distinguish the LO's used in the phone transceiver 410 and the GPS receiver 420. The terms first LO and second LO are not used to describe multiple LO's used in a receiver requiring multiple frequency conversions. The operation of the oscillator characterization circuit 430 is slightly different where two distinct LO's 450 and 550 are used. The phone transceiver 410 can continually receive the pilot signal and report the corresponding frequency error to the oscillator characterization circuit 430. The frequency error of the phone transceiver 410 first LO 550 is effectively used as a proxy for the GPS receiver 420 second LO 450 frequency error. When two LO's 450 and 550 are used, the wireless phone 500 does not need to operate in distinct phone and GPS modes provided sufficient processing capability exists within the wireless phone 500. Instead, the characterization of frequency error operates independently and simultaneously to the correction of frequency error in the GPS receiver second LO 450.

Figure 6A:
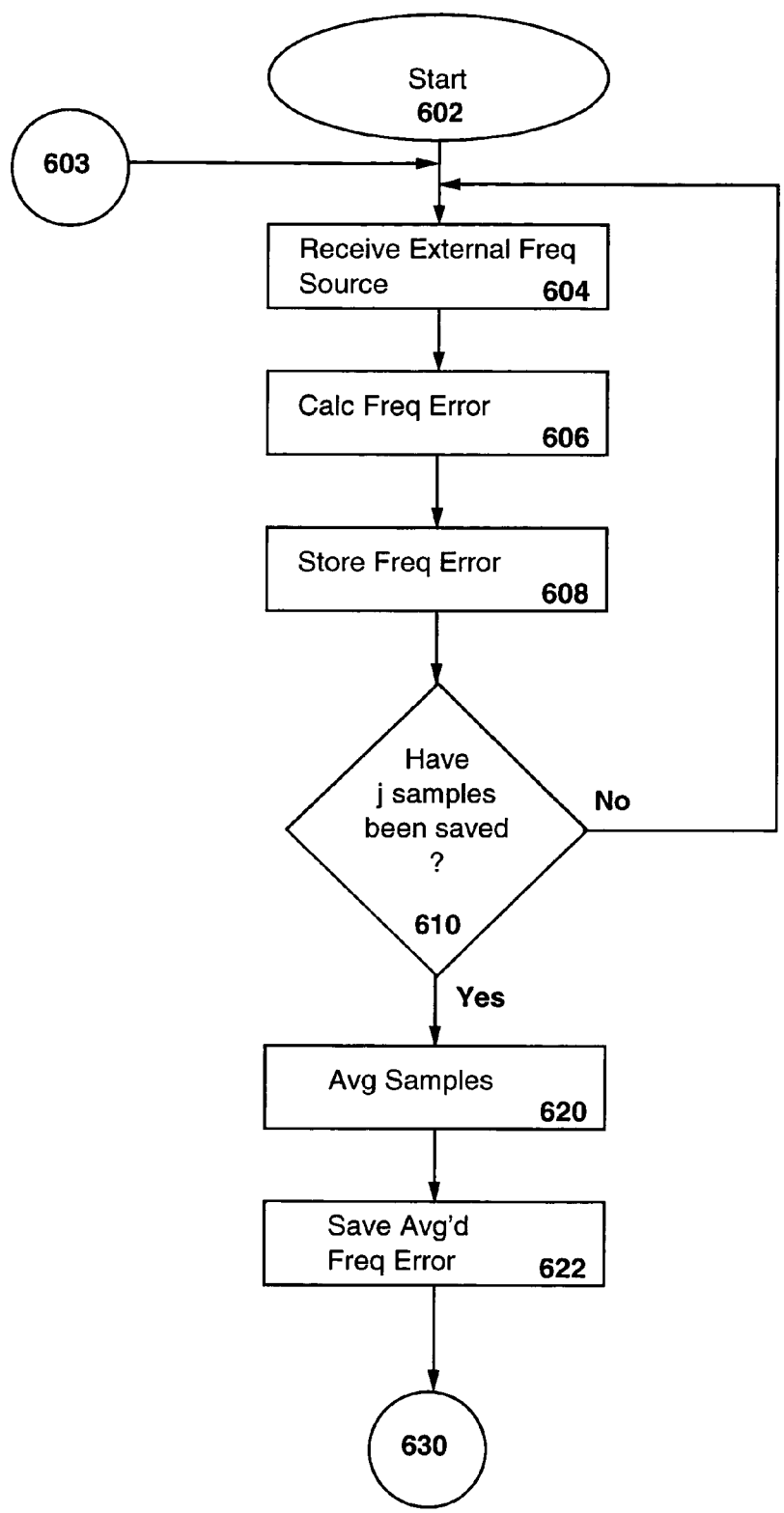
FIGS. 6A–6B are flow charts of the LO characterization process.
Figure 6B:
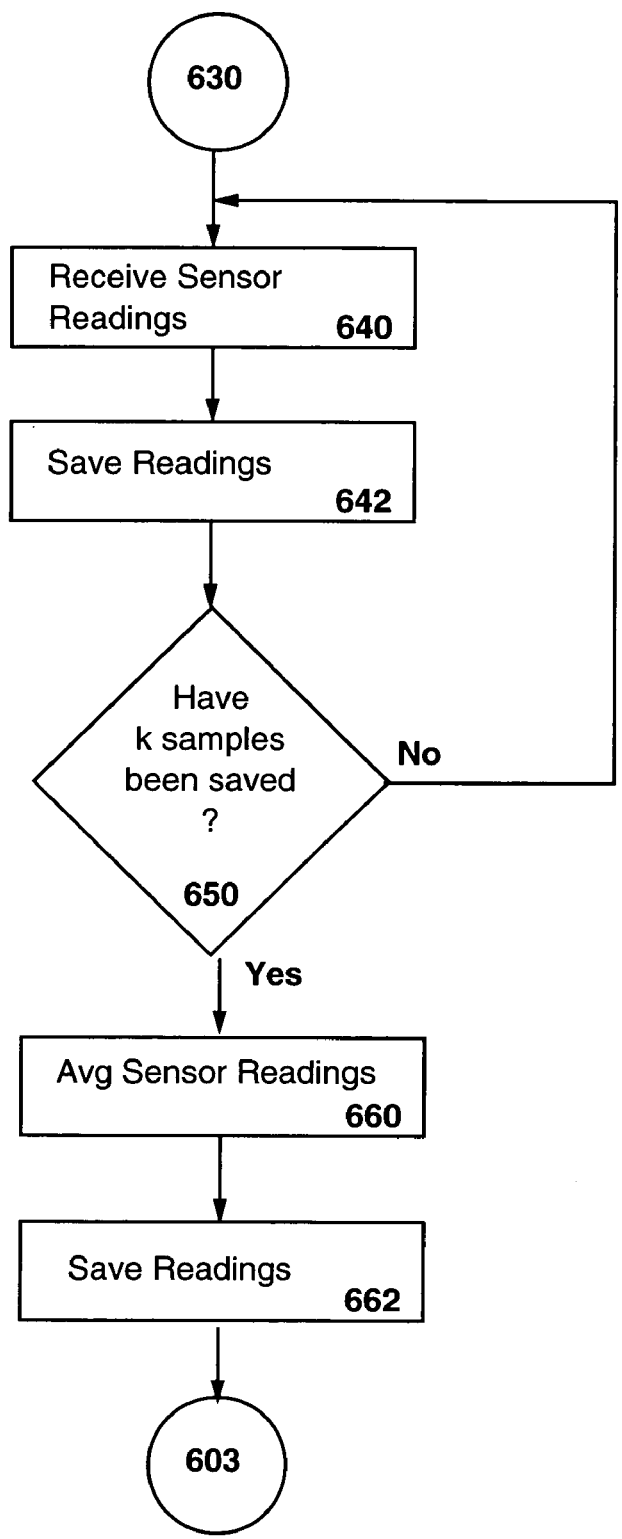

FIGS. 6A and 6B show a block diagram of the LO characterization process. Referring to FIG. 6A, the process starts at block 602. Block 602 may represent initiation of the LO characterization process by a control processor. Once the process is started the routine proceeds to block 604 where an external frequency source is received. The external frequency source can be input to the receiver or can be received over the air as described in the receiver of FIGS. 4 and 5. The external frequency source is used as a frequency reference in block 606 to calculate the LO frequency error. Where a CDMA pilot signal is used as the external frequency source, the CDMA receiver determines the LO frequency error. The routine proceeds to block 608 and stores the value of the frequency error determined in block 606. The routine then proceeds to decision block 610 to determine whether a predetermined number, j, of frequency error samples have been saved. The predetermined number, j, represents a number over which frequency error samples will be averaged. The number may be as low as one and as high as can be tolerated by hardware and timing constraints within the implementing device. If j samples have not yet been saved the routine proceeds back to block 604 to acquire additional samples. Once the predetermined number of samples, j, have been saved the routine proceeds to block 620 where the j frequency error samples are averaged. In an alternate embodiment a moving average of the frequency error can be calculated. The moving average has the advantage of being able to characterize the LO frequency over extremely long periods of time. The disadvantage is that the moving average may not respond quickly to changes in operating environment that result in LO frequency error.

Once the samples have been averaged the routine proceeds to block 622 where the averaged frequency error is saved in memory. After the averaged frequency error has been saved the routine proceeds to point 630. Point 630 does not represent a function of the routine. Instead, it is used merely to link FIG. 6A to FIG. 6B. Continuing in the routine at FIG. 6B, the routine proceeds to block 640 where sensor readings are received. At least one sensor reading is required and the upper limit of sensor readings is only limited by the amount of hardware and processing power available in the implementing device. The sensor readings are each saved in memory at block 642. The routine then proceeds to decision block 650 to determine whether a second predetermined number of samples, k, have been saved from each sensor. If the second predetermined number of sensor readings, k, have not yet been acquired and saved, the routine returns to block 640 to acquire further samples. Once the second predetermined number of sensor samples, k, have been acquired and saved, the routine proceeds to block 660 where each of the sensor readings is averaged over the k previously saved values. As in the case of the number of frequency error samples to be averaged, the number of sensor reading over which averaging is to be performed is chosen by the designer. The averaged sensor readings are saved in memory in block 662. The LO characterization process is complete at this point and the routine may either end or may continually characterize the LO by looping back to point 603 as is shown in FIG. 6B.

Figure 7:
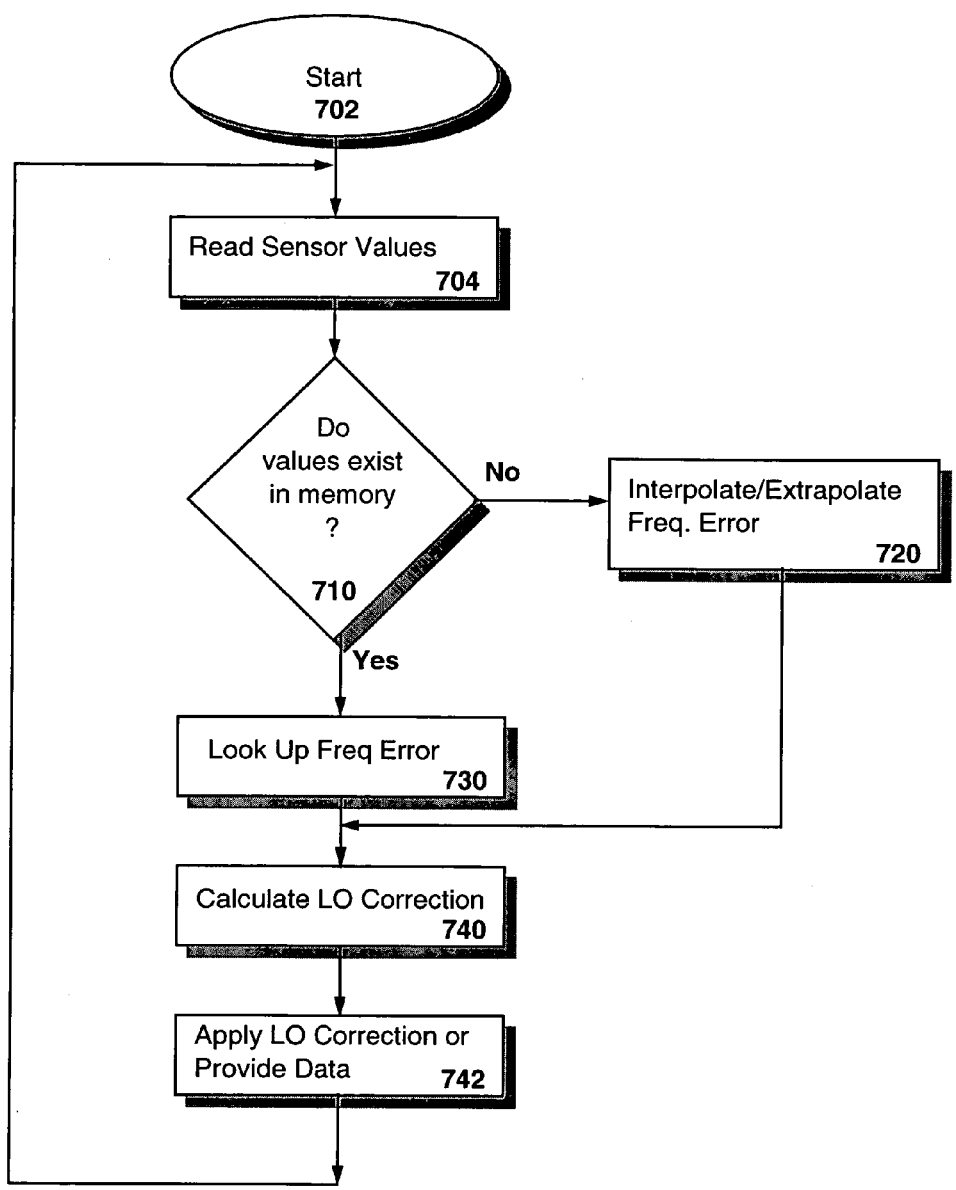
FIG. 7 is a flow chart of the LO compensation process.

FIG. 7 shows a block diagram of the LO compensation routine that operates once at least one loop of the LO characterization routine has occurred. The routine starts at block 702. The start could represent the initialization of GPS mode in a wireless phone that implements both a GPS receiver as well as a phone transceiver. Alternatively, the start may represent the end of one loop in the LO characterization routine where LO compensation occurs continually as may the LO characterization process.

The routine then proceeds to block 704 where the sensor values are read. These sensor readings represent the most recent sensor readings. The routine then proceeds to decision block 710 where the sensor values are compared against previously stored sensor readings. If the sensor readings match values already existing in the characterization array then the routine proceeds to block 730 where the frequency error corresponding to the saved sensor values is looked up in the array. However, if the sensor values do not already exist in the LO characterization array the routine proceeds to block 720 where the frequency error is calculated by interpolating or extrapolating the saved sensor readings to match the recent sensor readings and thereby generating an estimated LO frequency error. From either block 720 or 730 the routine proceeds to block 740 where the proper LO correction is calculated based upon the estimated LO frequency error. The LO correction is calculated by determining the frequency error from the LO characterization array and computing a LO control signal based upon knowledge of the transfer function relating the LO control line signal to output frequency. Where the LO control line is a voltage control signal for a VCO the transfer function is determined by the VCO gain. The routine proceeds to block 742 once the LO correction has been determined. At block 742 the routine applies the LO correction to the LO. Alternatively, or in addition to applying the LO correction the routine may report data to the GPS receiver. The data may consist of the determined LO frequency error and any correction applied to the LO. Using the information and the compensated LO, the GPS receiver is able to more quickly and efficiently acquire signals.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A device for compensating Local Oscillator (LO) frequency error comprising:
   a wireless phone receiver for receiving a base station signal;
   a GPS receiver including an LO;
   a circuit for receiving said base station signal and calculating an LO frequency error based thereupon;
   at least one sensor for monitoring a temperature gradient that contributes to LO frequency error; and
   an oscillator characterization circuit for receiving the calculated LO frequency error and readings from the at least one sensor, wherein the oscillator characterization circuit generates a compensation signal based upon the calculated LO frequency error and the readings from the at least one sensor.

2. The device of claim 1 wherein the oscillator characterization circuit applies the compensation signal to the LO to correct the LO frequency error.

3. The device of claim 1 wherein the oscillator characterization circuit operating in a first mode stores in a memory device the readings from the at least one sensor and the calculated LO frequency error and the oscillator characterization circuit operating in a second mode generates the compensation signal.

4. The device of claim 3 wherein the oscillator characterization circuit generates the compensation signal by comparing a recent set of readings from the at least one sensor to the readings stored in the memory device and generates the compensation signal based upon the corresponding calculated LO frequency error saved in the memory device.

5. The device of claim 3 wherein the oscillator characterization circuit interpolates or extrapolates the readings stored in the memory device to match a recent set of readings from the at least one sensor in order to generate an estimated LO frequency error and the oscillator characterization circuit generates the compensation signal based upon the estimated LO frequency error.

6. The device of claim 1 wherein the wireless phone receiver is adapted to receive Code Division Multiple Access (CDMA) signals.

7. The device of claim 6 wherein the base station signal is a CDMA pilot signal.

8. The device of claim 7 wherein the oscillator characterization circuit operating in a first mode stores in a memory device the readings from the at least one sensor and the calculated LO frequency error and the oscillator characterization circuit operating in a second mode generates the compensation signal.

9. The device of claim 8 wherein the oscillator characterization circuit applies the compensation signal to the LO to correct the LO frequency error.

10. The device of claim 8 wherein the at least one sensor comprises a temperature sensor.

11. A method for compensating Local Oscillator (LO) frequency error in a mobile phone system having a mobile phone receiver and a GPS receiver comprising:
    monitoring in a mobile phone operation mode at least one sensor reading of a temperature gradient in said mobile phone system and an LO frequency error, comprising:
    receiving with said mobile phone receiver a base station signal having a high frequency stability;
    generating the LO frequency error by comparing the base station signal to an LO frequency;
    receiving readings from the at least one sensor; and
    compensating in a GPS operation mode an estimated LO frequency error based upon the at least one sensor reading and the LO frequency error monitored in the mobile phone operation mode.

12. The method of claim 11 further comprising;
    storing the readings from the at least one sensor and the corresponding LO frequency error.

13. The method of claim 12 wherein the compensating step comprises:
    receiving a recent set of readings from the at least one sensor;
    generating the estimated LO frequency error using the recent set of readings from the at least one sensor and the readings from the at least one sensor received in the first mode;
    generating an LO correction signal from the estimated LO frequency error; and
    applying the LO correction signal to compensate the LO.

14. The method of claim 11 wherein the base station signal is a Code Division Multiple Access (CDMA) pilot signal.

15. The method of claim 14 wherein the at least one sensor comprises a temperature sensor.

* * * * *